(12) United States Patent
Zhang et al.

(10) Patent No.: US 11,064,607 B2
(45) Date of Patent: Jul. 13, 2021

(54) FLEXIBLE DISPLAY PANEL AND LOWER BEZEL STRUCTURE THEREOF

(71) Applicant: Wuhan China Star Optoelectronics Semiconductor Display Technology Co., Ltd., Hubei (CN)

(72) Inventors: Xiaoxia Zhang, Hubei (CN); Shoucheng Wang, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 301 days.

(21) Appl. No.: 15/749,474

(22) PCT Filed: Dec. 5, 2017

(86) PCT No.: PCT/CN2017/114517
§ 371 (c)(1),
(2) Date: Nov. 6, 2018

(87) PCT Pub. No.: WO2019/104745
PCT Pub. Date: Jun. 6, 2019

(65) Prior Publication Data
US 2020/0146147 A1 May 7, 2020

(30) Foreign Application Priority Data
Nov. 30, 2017 (CN) .......................... 201711239919.6

(51) Int. Cl.
*H05K 1/18* (2006.01)
*H05K 1/11* (2006.01)

(52) U.S. Cl.
CPC .............. *H05K 1/118* (2013.01); *H05K 1/189* (2013.01); *H05K 2201/094* (2013.01); *H05K 2201/10128* (2013.01)

(58) Field of Classification Search
CPC ........ H05K 1/117; H05K 1/118; H05K 1/189; H05K 1/147; H05K 2201/094;
(Continued)

(56) References Cited

U.S. PATENT DOCUMENTS

2007/0076577 A1* 4/2007 Furuichi ................ H05K 3/303
369/275.4
2010/0073620 A1 3/2010 Yamaguchi et al.
(Continued)

FOREIGN PATENT DOCUMENTS

CN 1690780 A 11/2005
CN 101060112 A 10/2007
(Continued)

OTHER PUBLICATIONS

English Machine Translation of Zhang (CN102097158) is provided with Office Action (Year: 2011).*

*Primary Examiner* — Roshn K Varghese
(74) *Attorney, Agent, or Firm* — Hemisphere Law, PLLC; Zhigang Ma

(57) ABSTRACT

The present disclosure provides a flexible display panel and a lower bezel structure thereof. The lower bezel structure includes a input end, a output end and a connecting portion connected between the input end and the output end, wherein the input end is used for connecting with a PCB of the flexible display panel, the output end is used for connecting with the display screen of the flexible display panel, the input end includes a plurality of interface areas, the plurality of interface areas are arranged in a straight line along a direction parallel to the connecting portion, and the plurality of interface areas include a COF interface area. By adopting the COF structure, the production cost of a single panel can be reduced, the length of the entire lower frame
(Continued)

can be reduced, the utilization of the production substrate can be increased, and the production cost can be reduced.

11 Claims, 3 Drawing Sheets

(58) Field of Classification Search
CPC ... H05K 2201/10128; H05K 2201/049; H05K 2201/052; H05K 2201/056; H05K 2201/10151; H05K 1/028; G09F 9/301; G09F 9/00; H01L 27/3276; H01L 27/323; H01L 51/5246; G06F 3/04164; G06F 3/0443; G06F 3/0446; G06F 3/0412; G06F 1/1652; G06F 2203/04102; G02F 1/13452; G02F 1/13338; G02F 2202/28
See application file for complete search history.

(56) References Cited

U.S. PATENT DOCUMENTS

| | | | |
|---|---|---|---|
| 2018/0011514 A1* | 1/2018 | Yoo | G06F 1/1626 |
| 2018/0014406 A1* | 1/2018 | Yang | H01L 27/3255 |
| 2018/0173277 A1* | 6/2018 | Lee | G06F 1/1652 |

FOREIGN PATENT DOCUMENTS

| | | |
|---|---|---|
| CN | 101900894 A | 12/2010 |
| CN | 102097158 A | 6/2011 |
| CN | 201993555 U | 9/2011 |
| CN | 202652688 U | 1/2013 |
| CN | 204557010 U | 8/2015 |
| CN | 105518765 A | 4/2016 |
| CN | 105741678 A | 7/2016 |
| CN | 206096680 U | 4/2017 |
| KR | 10-2008-0060615 A | 7/2008 |

* cited by examiner

FLEXIBLE DISPLAY PANEL AND LOWER BEZEL STRUCTURE THEREOF

RELATED APPLICATIONS

The present application is a National Phase of International Application Number PCT/CN2017/114517, filed Dec. 5, 2017, and claims the priority of China Application No. 201711239919.6, filed Nov. 30, 2017.

FIELD OF THE DISCLOSURE

The present disclosure relates to a flexible display technology field, and more particularly to a flexible display panel and a lower bezel structure thereof.

BACKGROUND OF THE DISCLOSURE

Nowadays, the flexible display device has become the new darling of the panel display field. The fixed curvature flexible curved screen mobile phone has become an increasingly popular product due to its ultra-narrow bezel and even borderless design. For a fixed curvature of the flexible display panel, in order to meet the curvature of the left and right sides, the lower bezel needs to be trimmed, so that the width of the lower bezel will be narrowed, and the entire lower bezel presents a T-shaped structure. In this case, if the lower frame still adopts a chip on film (COF) structure, and the COF pin and the FPC pin are to be placed at the same time, the panel screen will be limited, greatly limiting the product variety. Therefore, the fixed curvature of the flexible display panel to improve the design of the lower bezel is very necessary.

The existing lower bezel design ensures a narrow bezel as well. A bending area is generally added to bend the excess area that does not need to appear on the display to the rear of the panel, giving the user a visually narrow bezel effect. The existing lower bezel design directly uses the IC and the FPC up and down distribution, and the IC width is narrower. Therefore, this structure requires less the width of the entire lower bezel, but increases the length of the entire lower bezel, reducing the utilization of the entire panel during production and increasing the production cost.

SUMMARY OF THE DISCLOSURE

In order to solve the deficiencies of the prior art, the present disclosure provides a flexible display panel and its lower bezel structure, while ensuring that the COF structure with lower cost can be adopted, the length of the entire lower bezel can be reduced, the utilization of the production substrate can be increased, and the production cost can be reduced.

A specific technical solution proposed by the present disclosure is to provide a lower bezel structure of a flexible display panel, the lower bezel structure includes a input end, a output end and a connecting portion connected between the input end and the output end, wherein the input end is used for connecting with a PCB of the flexible display panel, the output end is used for connecting with the display screen of the flexible display panel, the input end includes a plurality of interface areas, the plurality of interface areas are arranged in a straight line along a direction parallel to the connecting portion, and the plurality of interface areas include a COF interface area.

Wherein the plurality of interface faces further includes a FPC interface area.

Wherein the COF interface area includes an IC chip and an alignment mark for aligning the IC chip.

Wherein the length of the connecting portion in the horizontal direction is smaller than the length of the input end in the horizontal direction.

Wherein the lower bezel structure further includes bending portions bent from two ends of the input end toward the output end respectively.

Wherein the bending portion is located between the input end and the output end.

Wherein the bending portion is perpendicular to the input end.

Wherein the length of the input end in the horizontal direction is greater than the length of the display screen in the horizontal direction.

Wherein the connecting portion is made of a flexible material.

The present disclosure further provides a flexible display panel, the flexible display panel includes a display screen, a PCB and the lower bezel structure as described above, the input end of the lower bezel structure is connected with the PCB, and the output end of the lower bezel structure is connected with the display screen.

The lower bezel structure of the flexible display panel provided by the present disclosure includes an input end, an output end, and a connecting portion connected between the input end and the output end, the input end includes a plurality of interface areas, the plurality of interface areas is arranged in a straight line along a direction parallel to the connecting portion, and the plurality of interface areas include a COF interface area. By adopting the COF structure, the production cost of a single panel can be reduced, the length of the entire lower bezel can be reduced, the utilization of the production substrate can be increased, and the production cost can be reduced.

DETAILED DESCRIPTION OF PREFERRED EMBODIMENTS

Figure 1:
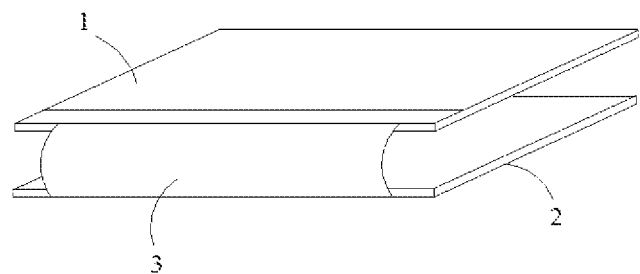
FIG. 1 is a schematic structural diagram of a flexible display panel in Embodiment 1.

Hereinafter, embodiments of the present disclosure will be described in detail with reference to the accompanying drawings. However, the disclosure may be embodied in many different forms and should not be construed as limited to the specific embodiments set forth herein. Rather, these embodiments are provided to explain the principles of the disclosure and its practical application to thereby enable those of ordinary skill in the art to understand various embodiments of the disclosure and various modifications as are suited to the particular use contemplated. In the drawings, the same reference numerals will always be used to refer to the same elements.

Embodiment 1

Figure 2:
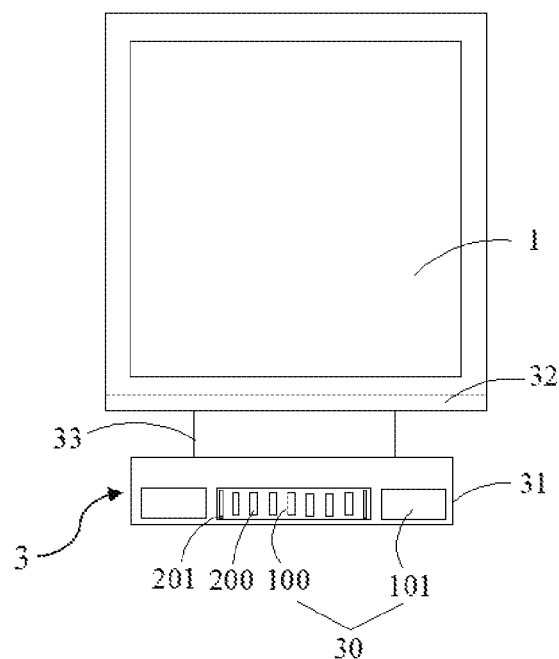
FIG. 2 is a schematic diagram of a lower bezel structure in Embodiment 1.

Referring to FIG. 1 and FIG. 2, the flexible display panel provided in this embodiment includes a display screen 1, a PCB 2 and a lower bezel structure 3. The lower bezel structure 3 includes an input end 31, an output end 32, and a connecting portion 33 connected between the input end 31 and the output end 32. The input end 31 is used for connecting with the PCB 2, the output end 32 is used for connecting with the display screen 1, the input end 31 includes a plurality of interface areas 30. The plurality of interface areas 30 are linearly distributed in a direction parallel to the connecting portion 33. The plurality of interface areas 30 includes a COF interface area 100.

In the actual assembly process, the PCB 2 is located on the back of the display screen 1, the display screen 1 and the PCB 2 are connected through the lower bezel structure 3. The input end 31 and the output end 32 can be bent relative to the connecting portion 33, so that the PCB 2 can be placed on the back of the display screen 1, so as to achieve the narrow bezel effect of the flexible display panel.

A plurality of interface areas 30 on the input end 31 are linearly distributed in a direction parallel to the connecting portion 33, that is, linearly distributed in the horizontal direction, reducing the length of the entire lower bezel structure 3, that is, the length in the vertical direction, improving the utilization of the entire panel, and reducing production costs.

In addition, by adopting the COF structure, the production cost of the single panel can be reduced, the length of the entire lower bezel structure 3 can be reduced, the utilization of the production substrate can be increased, and the production cost can be reduced.

The output end 32 is mainly used to set up some traces of the display screen 1, static protection devices or test devices. The plurality of interface areas 30 further includes an FPC interface area 101, the COF interface area 100 includes an IC chip 200 and an alignment mark 201 for aligning the IC chip 200.

The length of the connecting portion 33 in the horizontal direction in the present embodiment is smaller than the length of the input end 31 in the horizontal direction, meanwhile, the length of the connecting portion 33 in the horizontal direction is also smaller than the length of the output end 32 in the horizontal direction, the length of the output end 32 in the horizontal direction is equal to the length of the display screen 1 in the horizontal direction.

Figure 3:
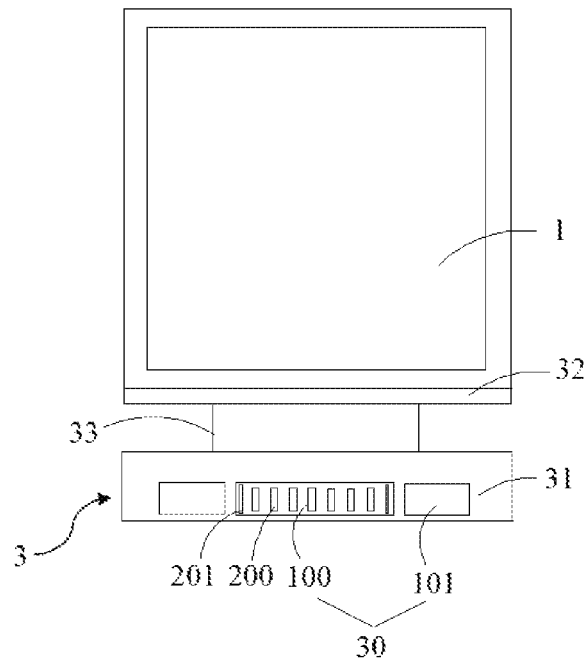
FIG. 3 is another schematic diagram of a lower bezel structure in Embodiment 1.
Figure 4:
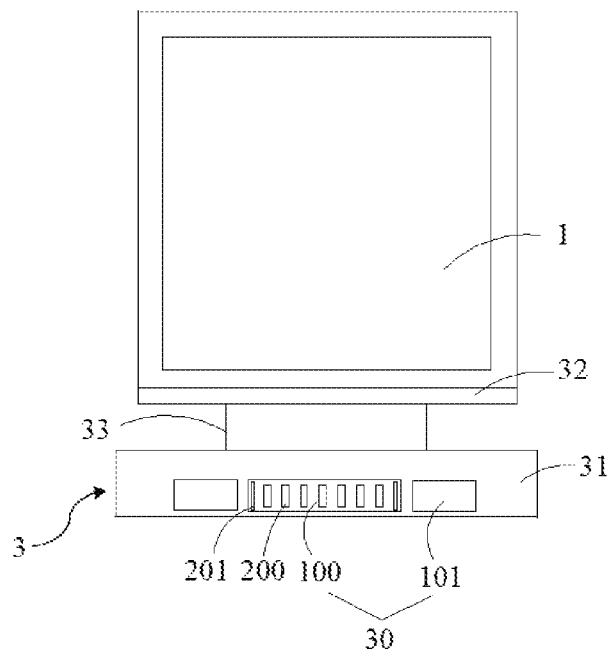
FIG. 4 is a further schematic diagram of a lower bezel structure in Embodiment 1.
Figure 5:
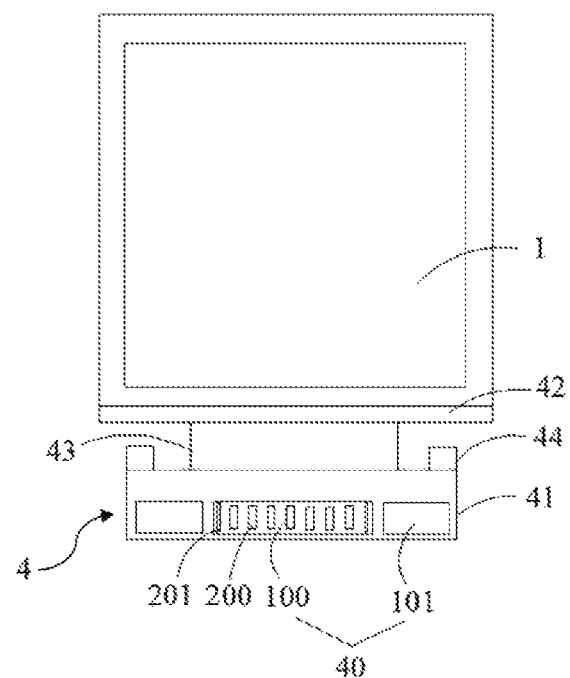
FIG. 5 is a schematic diagram of a lower bezel structure in Embodiment 2.

Referring to FIG. 2. FIG. 3 and FIG. 4, the length of the input end 31 in the horizontal direction can be adjusted according to actual needs. For example, if the number of lines or devices to be provided is relatively less, the length of the input end 31 in the horizontal direction may be shorter than the length of the display screen 1 in the horizontal direction. The length of the input end 31 in the horizontal direction may be the same as the length of the display screen 1 in the horizontal direction or longer than the length of the display screen 1 in the horizontal direction if more lines or devices need to be provided.

In the present embodiment, the connecting portion 33 is made of a flexible material, in this way, the lower bezel structure 3 can place the PCB 2 on the back of the display screen 1 through the bending of the connecting portion 33, so as to realize the narrow bezel design of the flexible display panel. By selecting the material of the connecting portion 33 as a flexible material, the circuit of the flexible display panel can be prevented from breaking due to being broken during the bending process, and the stability of the entire flexible display panel can be improved.

Embodiment 2

Referring to FIG. 3 and FIG. 4, the lower bezel structure 4 in the present embodiment includes an input end 41, an output end 42, and a connecting portion 43 connected between the input end 41 and the output end 42. The input end 41 is connected to the PCB 2. The output end 42 is connected to the display screen 1. The input end 41 includes a plurality of interface areas 40. The plurality of interface areas 40 are arranged in a straight line in a direction parallel to the connecting portion 43. The lower bezel structure 4 further includes bending portions 44 respectively bent from two ends of the input end 41 toward the output end 42.

The bending portion 44 is located between the input end 41 and the output end 42, that is, the length of the bending portion 44 in the vertical direction is smaller than the interval between the input end 41 and the output end 42. The bending portion 44 is perpendicular to the input end 41. By providing the bending portion 44, the design space of the lower bezel structure 4 can be further increased, and other devices than the COF interface area 100 and the FPC interface area 101 can be disposed on the input end 41.

The plurality of interface areas 40 on the input end 41 are linearly distributed along the direction parallel to the connecting portion 43, that is, they are linearly distributed in the horizontal direction, reducing the length of the entire lower bezel structure 4, that is, the length in the vertical direction.

The output end 42 is mainly used to set some lines, ESD devices or test devices of the display screen 1. The plurality of interface areas 40 includes a COF interface area 100, an FPC interface area 101, and the COF interface area 100 includes an IC chip 200 and an alignment mark 202 for aligning the IC chip 200.

By adopting the COF structure, the production cost of a single panel can be reduced, the length of the entire lower bezel structure 4 can be reduced, the utilization of the production substrate can be increased, and the production cost can be reduced.

The length of the connecting portion 43 in the horizontal direction in the present embodiment is smaller than the length of the input end 41 in the horizontal direction. Meanwhile, the length of the connecting portion 43 in the horizontal direction is also smaller than the length of the output end 42 in the horizontal direction. The length of the output end 42 in the horizontal direction is equal to the length of the display screen 1 in the horizontal direction.

The length of the input end 41 in the horizontal direction can be adjusted according to actual needs. For example, if the number of lines or devices to be provided is relatively less, the length of the input end 41 in the horizontal direction may be shorter than the length of the display screen 1 in the horizontal direction. The length of the input end 41 in the horizontal direction may be the same as the length of the display screen 1 in the horizontal direction or longer than the length of the display screen 1 in the horizontal direction if more lines or devices need to be provided.

In the present embodiment, the connecting portion 43 is made of a flexible material so that the lower bezel structure 4 can place the PCB 2 on the back of the display screen 1 by the bending of the connecting portion 43, so as to realize the narrow bezel design of the flexible display panel. By selecting the material of the connecting portion 43 as a flexible material, the circuit of the flexible display panel can be prevented the abnormal phenomenon due to being broken during the bending process, which improves the stability of the entire flexible display panel.

The foregoing descriptions are merely specific implementation manners of the present application. It should be noted that those skilled in the art may make various improvements and modifications without departing from the principle of the present application, and these improvements and modifications should also be considered as falling within the protection scope of the present application.

What is claimed is:

1. A lower bezel structure of a flexible display panel, comprising a single panel formed as one piece further comprising a display screen, an output portion, an input portion, and a connecting portion connected between the input portion and the output portion; wherein the output portion is adjacent to the display screen and connected thereto, the input portion is disposed away from the display screen and used for connecting with a PCB of the flexible display panel; where in a plan view, the single panel comprises a first peripheral edge on a first side of the display screen and a second peripheral edge on an opposite side of the display screen, wherein the output portion, the connecting portion and the input portion are rectangular, and a length of the connecting portion from the first peripheral edge to the second peripheral edge is smaller than a length of the input portion from the first peripheral edge to the second peripheral edge in horizontal direction; wherein a plurality of interface areas are arranged inside the input portion, and disposed in a straight line along a direction parallel to the connecting portion, and the plurality of interface areas comprise a COF interface area; wherein the lower bezel structure further comprises two bending portions protrude from two ends of the input portion toward the output portion respectively, the bending portions are perpendicular to the input portion, and the bending portions are located between the input portion and the output portion, a length of the bending portion in vertical direction is smaller than the interval between the input portion and the output portion; wherein the single panel comprises a third peripheral edge facing the display screen at the bending portions and a fourth peripheral edge at the input portion facing the display screen, such that in the plan view, the third peripheral edge is closer to the display screen than the fourth peripheral edge.

2. The lower bezel structure according to claim 1, wherein the plurality of interface area further comprises a FPC interface area.

3. The lower bezel structure according to claim 2, wherein the length of the input portion is greater than a length of the display screen in horizontal direction.

4. The lower bezel structure according to claim 3, wherein the connecting portion is made of a flexible material.

5. The lower bezel structure according to claim 1, wherein the COF interface area comprises an IC chip and an alignment mark for aligning the IC chip.

6. The lower bezel structure according to claim 1, wherein the length of the input portion is greater than a length of the display screen in horizontal direction.

7. The lower bezel structure according to claim 6, wherein the connecting portion is made of a flexible material.

8. The lower bezel structure according to claim 1, wherein the length of the input portion is greater than a length of the display screen in horizontal direction.

9. The lower bezel structure according to claim 8, wherein the connecting portion is made of a flexible material.

10. A flexible display panel comprising a single panel formed as one piece, further comprising a display screen, a PCB and a lower bezel structure, wherein the lower bezel structure comprises an input portion, an output portion and a connecting portion connected between the input portion and the output portion; wherein the input portion is disposed away from the display screen and used for connecting with a PCB of the flexible display panel, the output portion is adjacent to the display screen and connected thereto; where in a plan view the single panel comprises a first peripheral edge on a first side of the display screen and a second peripheral edge on an opposite side of the display screen, wherein the output portion, the connecting portion and the input portion are rectangular, and a length of the connecting portion from the first peripheral edge to the second peripheral edge is smaller than a length of the input portion from the first peripheral edge to the second peripheral edge in horizontal direction; wherein a plurality of interface areas are arranged inside the input portion, and disposed in a straight line along a direction parallel to the connecting portion, and the plurality of interface areas comprise a COF interface area, the input portion of the lower bezel structure is to be connected with the PCB, and the output portion of the lower bezel structure is connected with the display screen; and wherein the flexible display panel further comprises two bending portions protrude from two ends of the input portion toward the output portion respectively, the bending portions are perpendicular to the input portion, and the bending portions are located between the input portion and the output portion, a length of the bending portion in vertical direction is smaller than the interval between the input portion and the output portion; wherein the single panel comprises a third peripheral edge facing the display screen at the bending portions and a fourth peripheral edge at the input portion facing the display screen, such that in the plan view, the third peripheral edge is closer to the display screen than the fourth peripheral edge.

11. The flexible display panel according to claim 10, wherein the plurality of interface areas further comprises an FPC interface area.

* * * * *